(12) United States Patent
Verlinden et al.

(10) Patent No.: US 10,379,804 B2
(45) Date of Patent: Aug. 13, 2019

(54) SUPPORT FRAME FOR VIDEO WALL

(71) Applicant: Martin Professional ApS, Aarhus N (DK)

(72) Inventors: Wouter Verlinden, Keerbergen (BE); Lars Barslund Kjaer, Hovedgaard (DK)

(73) Assignee: HARMAN PROFESSIONAL DENMARK APS, Aarhus N. (DK)

( * ) Notice: Subject to any disclaimer, the term of this patent is extended or adjusted under 35 U.S.C. 154(b) by 23 days.

(21) Appl. No.: 15/140,247

(22) Filed: Apr. 27, 2016

(65) Prior Publication Data
US 2016/0328203 A1 Nov. 10, 2016

(30) Foreign Application Priority Data

May 5, 2015 (EP) .................................. 15166326

(51) Int. Cl.
| G06F 3/14 | (2006.01) |
| G09F 9/302 | (2006.01) |
| G09F 19/22 | (2006.01) |
| F16M 13/02 | (2006.01) |
| H05K 7/18 | (2006.01) |

(52) U.S. Cl.
CPC ........... *G06F 3/1446* (2013.01); *F16M 13/02* (2013.01); *G09F 9/3026* (2013.01); *G09F 19/22* (2013.01); *H05K 7/183* (2013.01)

(58) Field of Classification Search
CPC ........ F16M 13/02; F16M 11/08; F16M 11/10; G06F 3/1446; G09F 19/22; G09F 9/3026; G09F 9/33; H05K 7/183; E04B 2/7425; E04B 9/006; F21S 8/00; F21S 8/026; H01F 38/14; A47B 81/06; A47B 57/40; H02G 3/20; F21V 21/35
See application file for complete search history.

(56) References Cited

U.S. PATENT DOCUMENTS 5,305,567 A * 4/1994 Wittler .................. E04B 2/7425
  160/135
6,314,669 B1  11/2001 Tucker
7,369,401 B1 * 5/2008 Floersch ................ F16M 11/08
  292/301
(Continued)

FOREIGN PATENT DOCUMENTS

| EP | 1092914 A2 | 4/2001 |
| EP | 2669881 A1 | 12/2013 |
| GB | 632302 A | 11/1949 |

OTHER PUBLICATIONS

European Search Report for Application No. 15 166 326.7, dated Mar. 11, 2015.

*Primary Examiner* — Richard J Hong
(74) *Attorney, Agent, or Firm* — Artegis Law Group, LLP

(57) ABSTRACT

The present invention relates to a support frame configured to be incorporated into a plurality of interconnected video panels which each emit light to a front side of the interconnected video panels, the support frame comprising at least one connecting element configured to connect the support frame to at least one of the video panels, and an attachment mechanism designed to secure at least one illumination device in such a way that the illumination device fixedly secured to the attachment mechanism emits light to the front side of the interconnected video panels.

17 Claims, 9 Drawing Sheets

(56) References Cited

U.S. PATENT DOCUMENTS

| | | | |
|---|---|---|---|
| 2003/0058191 A1 | 3/2003 | Yuhara et al. | |
| 2005/0237732 A1* | 10/2005 | Lagman | A47B 57/40 362/132 |
| 2007/0000849 A1* | 1/2007 | Lutz | G09F 9/33 211/26 |
| 2007/0002558 A1* | 1/2007 | Pryor | F21V 21/35 362/147 |
| 2007/0012847 A1* | 1/2007 | Tai | E04B 9/006 248/343 |
| 2008/0054147 A1* | 3/2008 | Muday | F16M 11/10 248/316.8 |
| 2008/0104895 A1* | 5/2008 | Deweerd | E04B 2/7425 52/79.9 |
| 2009/0309494 A1* | 12/2009 | Patterson | G09F 9/33 313/512 |
| 2010/0219183 A1* | 9/2010 | Azancot | H01F 38/14 219/676 |
| 2013/0265756 A1* | 10/2013 | Christoffersen | F21S 8/00 362/235 |
| 2013/0265765 A1* | 10/2013 | Liang | G09F 9/3026 362/249.02 |
| 2014/0319978 A1* | 10/2014 | Lemieux | A47B 81/06 312/7.2 |
| 2015/0007469 A1 | 1/2015 | Nall et al. | |
| 2016/0033098 A1* | 2/2016 | Bergman | H02G 3/20 362/418 |
| 2016/0084488 A1* | 3/2016 | Wu | F21S 8/026 362/364 |

* cited by examiner

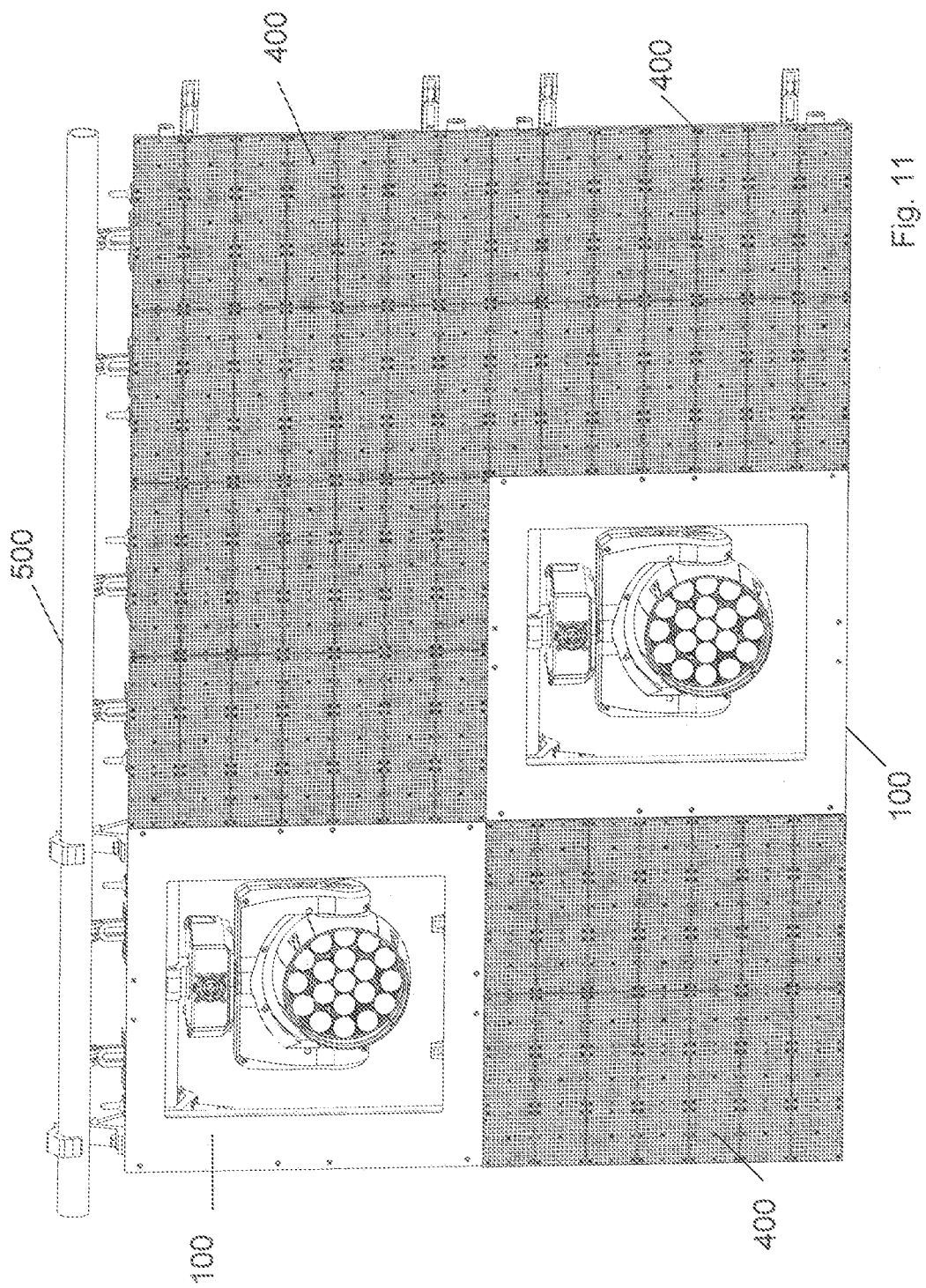

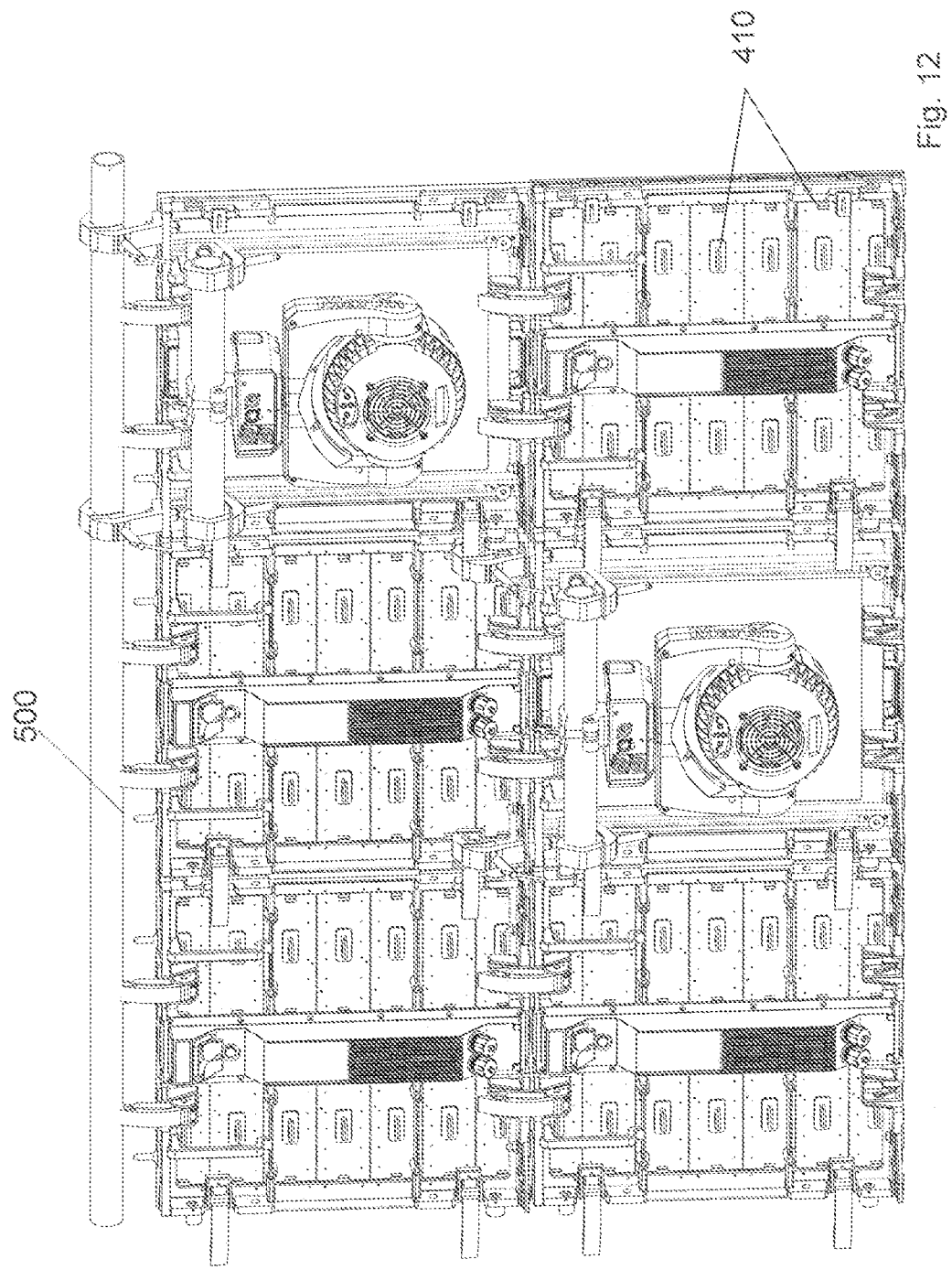

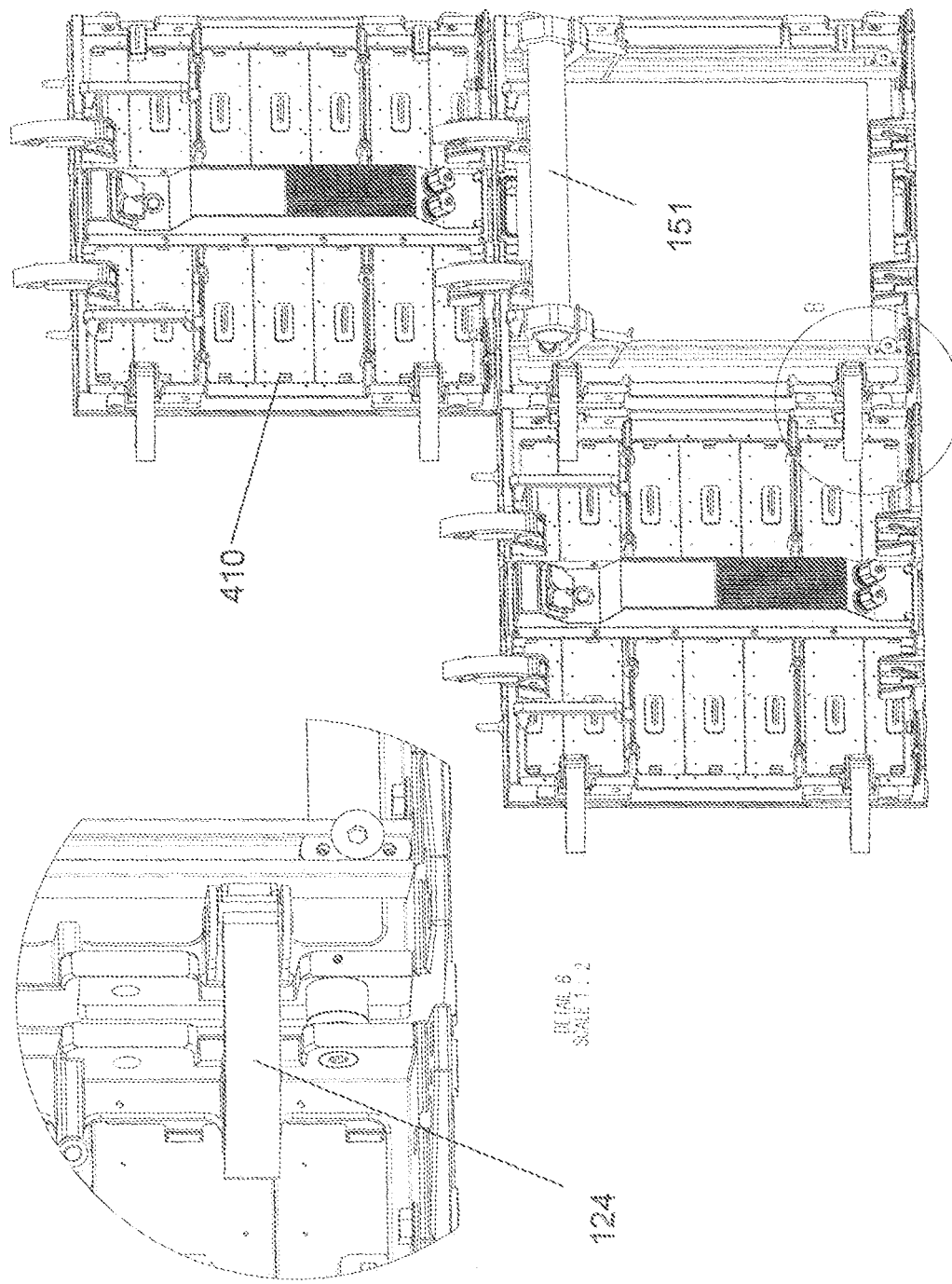

SUPPORT FRAME FOR VIDEO WALL

CROSS-REFERENCE TO RELATED APPLICATIONS

This application claims priority to EP patent application titled, "Support Frame for Video Wall," filed on May 5, 2015 and having Application No. EP 15 16 6 326.7. The subject matter of this related application is hereby incorporated herein by reference.

TECHNICAL FIELD

The present invention relates to a support frame configured to be incorporated into a plurality of interconnected video panels and furthermore to a system comprising the plurality of interconnected video panels and the support frame.

BACKGROUND

Interconnected video panels which form a video wall are used for entertainment, architectural and advertising purposes and contain a number of light sources forming a number of pixels, such as LEDs or any other suitable light elements, such as video strips, organic light emitting diodes (OLEDs), fiber-optic lights, fluorescent lights, polymer light emitting diodes, or a combination thereof. The different light emitting elements are mounted to each of the interconnected video panels and can be turned on and off to create patterns of video displays. These video walls are often operated in conjunction with other multimedia systems with other lighting fixtures and sound, e.g. as part of a concert, performance, or a stage production. The video wall containing the plurality of interconnected video panels can generate large display screens and normally contain a plurality of pixels, e.g. only LEDs or LEDs of different colors. The effects that can be generated with these kinds of interconnected video panels are somehow limited compared to other lighting elements known in the entertainment industry.

Accordingly, a need exists to increase the versatility of such video walls with the plurality of interconnected video panels.

SUMMARY

This need is met by the features of the independent claims. Further aspects are described in the dependent claims.

According to a first aspect, a support frame configured to be incorporated into the plurality of interconnected video panels is provided, wherein each of the video panels emits light to a front side of the interconnected video panels. The support frame comprises at least one connecting element configured to connect the support frame to at least one of the video panels. The support frame furthermore comprises an attachment mechanism designed to secure at least one illumination device in such a way that the illumination device which is fixedly secured to the attachment mechanism emits light to the front side of the video wall.

This support frame can be integrated into the plurality of interconnected video panels where the attachment mechanism helps to secure the illumination device which also emits light to the front side, wherein the illumination device emits light which differs from the light emitted by the video panel by at least one light parameter. The light characteristic which is different can include one of the following: a light intensity, a geometry of the light beam, a light color. The light emitted from the illumination device differs from the light emitted by the video panels. Thus, other illumination devices which can provide a variety of light effects can be integrated into the plurality of interconnected video panels. Furthermore, there is no need to provide additional structures such as truss systems for the illumination device. The support frame can be easily added to the interconnected video panels or one video panel can be replaced by the support frame so that in addition to the light effects that are possible with the interconnected video panels, further light effects are possible using the illumination device attached to the attachment mechanism of the support frame. Additionally in connection with the touring industry where the video and lighting equipment often are packed, shipped and unpacked at a new site this support frame makes is possible to easily disassemble, ship and re assemble the interconnected video panels, as the support frame provides to opportunity to keep the illumination device at the support frame during disassembling shipment and reassembling of the interconnected video panels. The support frame can comprise four frame elements which enclose a central opening. The attachment mechanism can be connected to two opposite frame elements and can be designed such that the illumination device fixedly secured to the attachment mechanism emits the light through the central opening to the front side. Here, the support structure forms a frame structure with the four frame elements and when the attachment mechanism is connected to two of the frame elements, the illumination device can be positioned such that it can emit light in the same direction as the light sources provided at the plurality of interconnected video panels. The four frame elements strengthen the support frame and make it easier to align the support frame with the video panels when integrating the support frame into a video display system.

This invention furthermore relates to a system comprising a plurality of interconnected video panels, wherein each video panel comprises at least one first light source and each video panel emits light to the front side of the interconnected video panels. The system furthermore comprises a support frame as discussed above. The connecting element of the support frame is connected to at least one of the video panels. The illumination device of the support frame comprises at least one second light source which differs from the first light source in at least one light parameter. Preferably, the first light sources of the plurality of video panels are located such that they build a first planar surface. The at least one second light source of the illumination device can furthermore have a different position compared to the first lights source of the video panel and can be arranged at a second surface which is different from the first planar surface. However, the illumination device may also be located at the same surface as the first light sources.

This means that the first light sources are located at a different plane than the second light sources. The first sources form the video wall, whereas the second light source or the second light sources connected to the support frame are located at a different plane, e.g. behind the first planar surface when seen from the front side of the interconnected video panels. Furthermore, it is possible that the at least one second light source is displaceable relative to the first light sources. This means that the second light source is movable, e.g. when second light sources are provided in a moving head light fixture. The first light sources of the interconnected video panels are static light sources and can normally not be moved. Concerning the light parameter of the first and second light source, the first light source or light sources may differ from the second light source by the type of light source used, by the lumen or luminous flux emitted by the light source or by the power emitted by the first or second light sources. For instance the first at least one light source of the neighboring video panel and second at least one light source of the at least one illumination device at the support frame may be different in that the second light source of the at least one illumination device emits more light than the first light sources of one of the neighbouring video panels. In one embodiment the second light source emits at least twice as much light as the first light source of a neighboring video panel. The consequence is that the light emitted by the at least one illumination device appears more bright than the light emitted by the neighbouring video panels and the illumination device can thus be used to create illumination and mid air light effects which is noticeable in relation the light created by the video panels. The first and second light sources can both use LEDs but the LEDs used for the second light source may differ from the LEDs of the first light source by at least one of the light parameters mentioned above.

Features mentioned above and the features yet to be explained below may not only be used in isolation or in combination as explicitly indicated, but also in other combinations. Features and embodiments of the present application may be combined unless explicitly mentioned otherwise.

BRIEF DESCRIPTION OF THE DRAWINGS

Various features of embodiments will become more apparent when read in conjunction with the accompanying drawings. In these drawings:

FIG. 11 shows a system comprising a plurality of interconnected video panels and two support frames connected to the video panels, FIG. 12 shows a rear view of the system of FIG. 11, and FIG. 13 shows a more detailed view of how a support frame is connected to a video panel.

DETAILED DESCRIPTION

Figure 1:
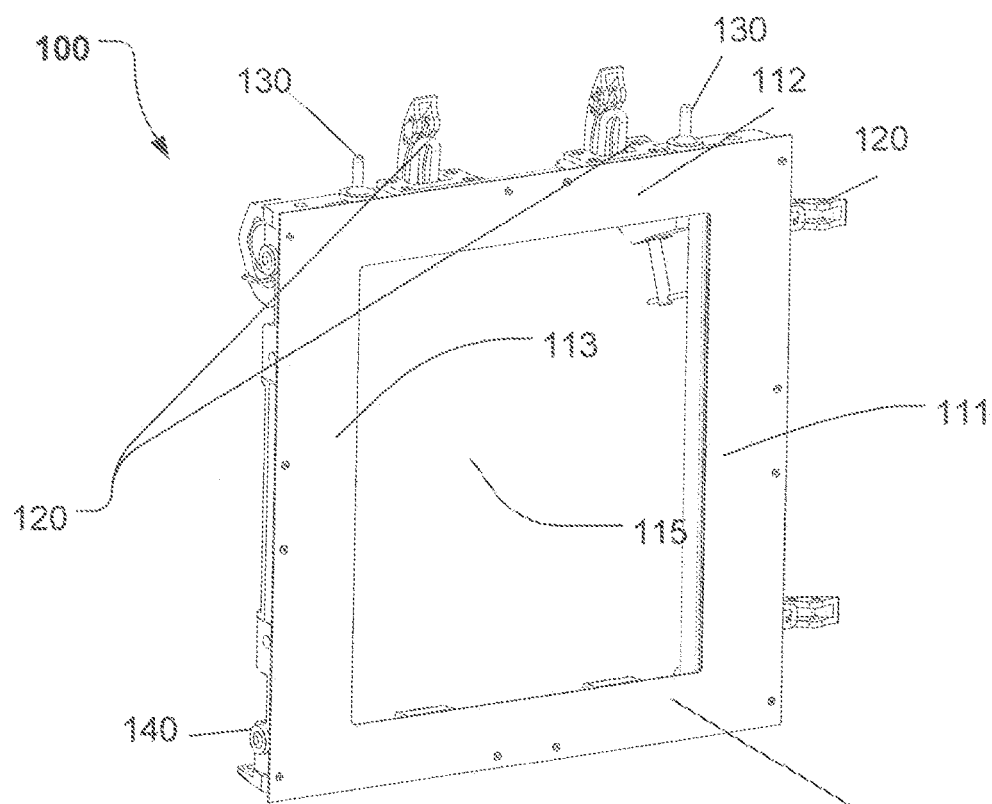
FIG. 1 is a schematic perspective front view of a support structure configured to be incorporated into a plurality of interconnected video panels.

In the following, embodiments of the application will be described in detail with reference to the accompanying drawings. It is to be understood that the following description of embodiments is not to be taken in a limiting sense. The scope is not intended to be limited by the embodiments described hereinafter or by the drawings which are to be taken demonstratively only.

The drawings are to be regarded as being schematic representations and elements illustrated in the drawings are not necessarily shown to scale.

In the following, a support frame will be described in more detail, which can be incorporated into a video wall which comprises a plurality of interconnected video panels. The video panels can comprise a number of LED pixels or other light sources which are configured to create a video image based on a video signal.

FIG. 1 shows a schematic view of a first embodiment of a support frame 100 which can be incorporated into a plurality of video panels as shown in a system described in connection with FIGS. 11 to 13 later on. The support frame 100 comprises four frame elements 110-113. It should be understood that the four frame elements need not be provided as separate pieces, the four frame elements may be build as a one-piece element. The four frame elements 110-113 enclose a central opening 115. As will be explained in more detail further below in connection with FIG. 4 ff, light of an illumination device fixedly secured to the support frame can pass through the central opening 115. The support frame comprises different connecting elements 120 via which the support frame can be connected to other video panels as will be explained in more detail in connection with FIG. 13 later on. The support frame furthermore comprises connecting pins 130, which further help to connect the support frame to a neighboring support frame or to a neighboring video panel. A further connecting element in the form of a connecting receptacle 140 is provided. The support frame can be designed such that on one of the side surfaces at which the support frame is connected to a video panel connecting pins 130 are provided, whereas on another side connecting receptacle 140 may be provided. In another embodiment, it is possible that on one side surface one connecting pin 130 and one connecting receptacle 140 is provided. The connecting pin 130 can cooperate with a corresponding connecting receptacle located on a neighboring video panel or a neighboring support frame so that the support frame 100 and a neighboring video panel can be aligned relative to each other.

Figure 2:
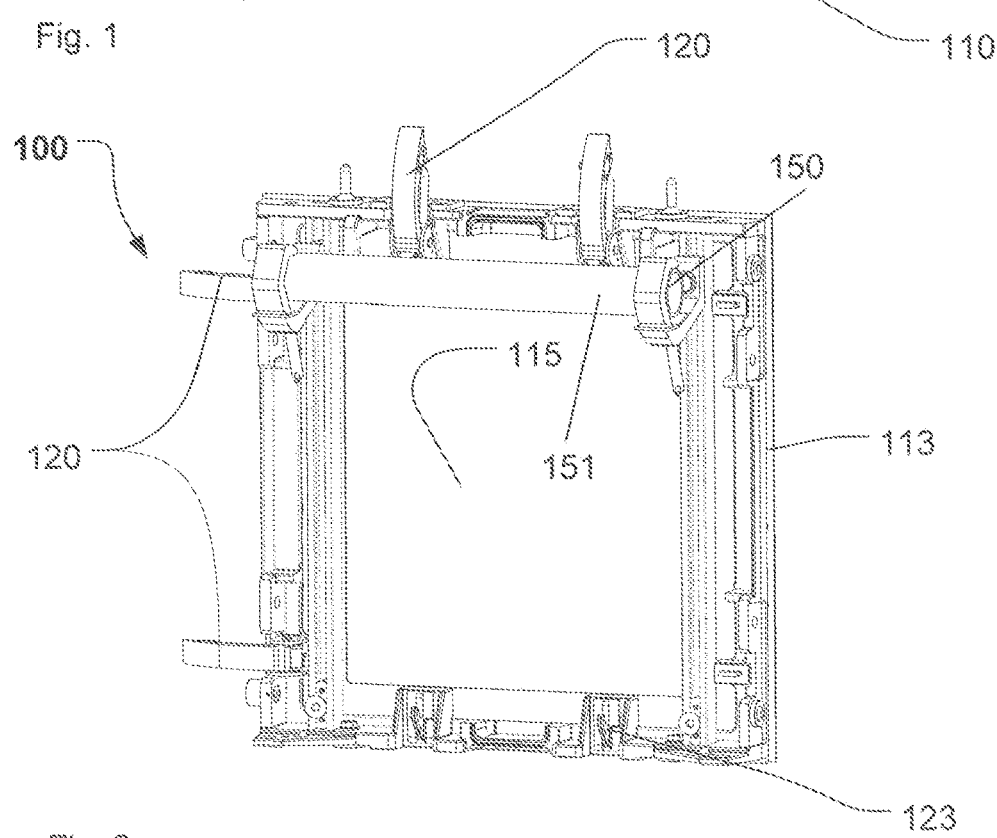
FIG. 2 is a perspective rear view of the support frame of FIG. 1.
Figure 3:
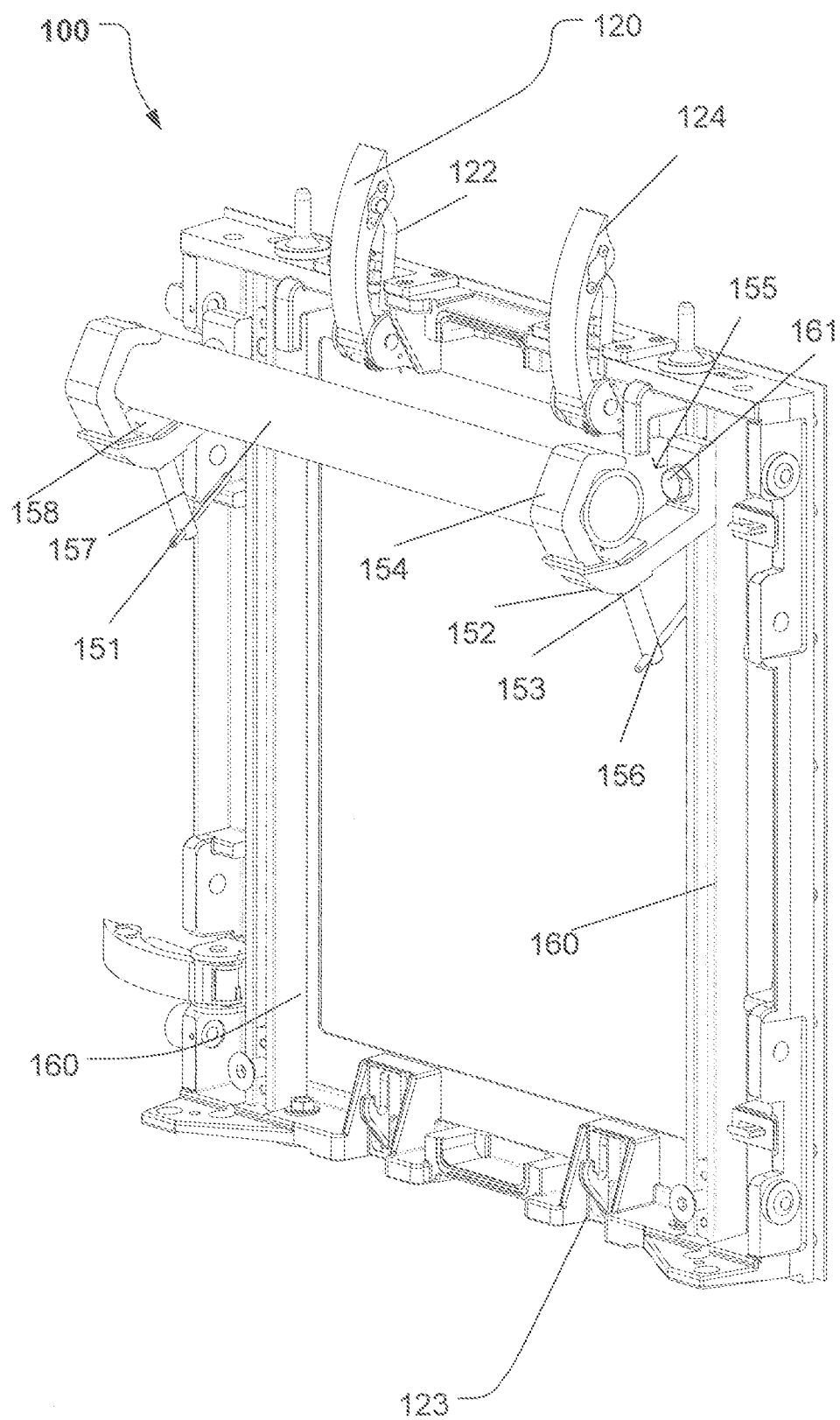
FIG. 3 is more detailed perspective rear view of the support frame shown in FIGS. 1 and 2.

FIGS. 2 and 3 show a perspective rear view of the support frame of FIG. 1. In connection with FIGS. 2 and 3, the attachment mechanism 150 is explained in more detail. The attachment mechanism, which is also shown in larger scale in FIG. 3, comprises a fixing bar 151, which is connected to the support frame via two mounting elements 152. Each mounting element 152 comprises an arm 153 and a receiving portion 154 connected to the arm. The receiving portion forms a receiving space 155, which is generated by a concave inner surface of the receiving portion. The fixing bar 151 can be placed in the receiving portion 154 and the receiving space 155 can be reduced in size using a securing mechanism 156. By way of example, the securing mechanism can comprise a threaded portion 157 and a support surface 158 upon which the fixing bar is located when placed in the receiving portion 154. The threaded portion 157 passes through an opening (not shown) in the arm 153, the opening comprising a corresponding threaded portion. By turning the threaded portion 157, the support surface 158 will press the fixing bar 151 against the upper part of the inner surface of the receiving portion 154.

Figure 4:
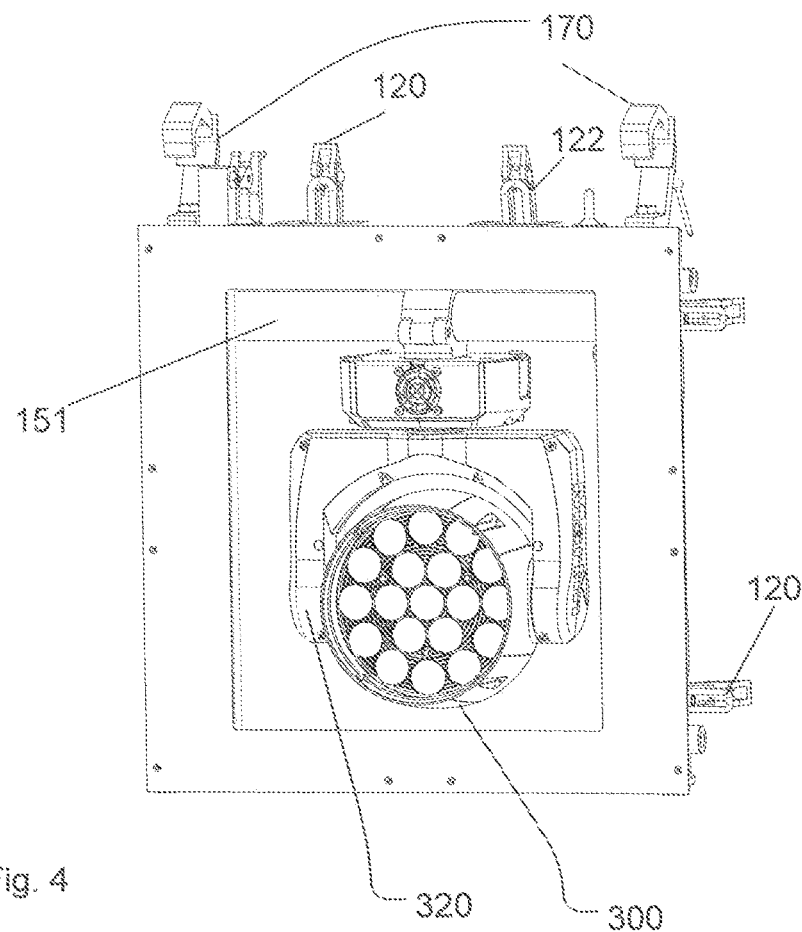
FIG. 4 shows another embodiment of a support frame configured to be incorporated into a plurality of video panels, wherein a moving head light fixture is secured to the support frame.
Figure 5:
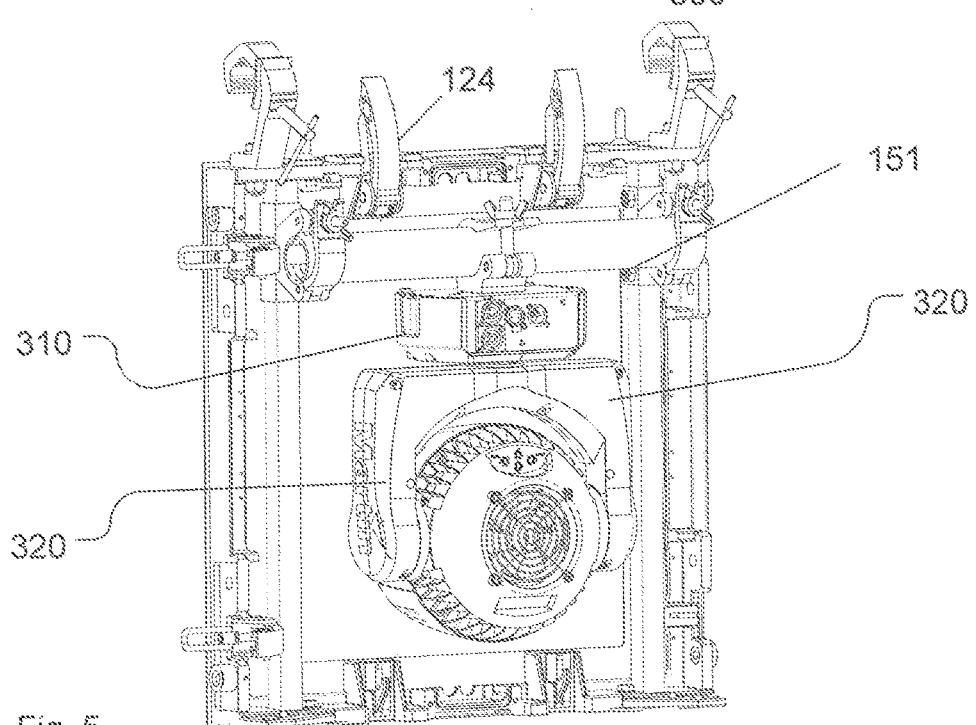
FIG. 5 is a perspective rear view of the support frame of FIG. 4.

As can be seen in FIGS. 4 and 5, which will be described later on in more detail, the fixing bar can be used to secure an illumination device 300, which, in the embodiment of FIGS. 4 and 5 is a moving head light fixture.

As can be especially deduced from FIG. 3, the attachment mechanism is connected to two opposite frame elements via rail elements 160. The mounting element 150 is connected to the support structure via the rail element in such a way that the height of the attachment mechanism relative to the support frame can be amended. In the embodiment shown, the arm 152 is connected at one end to the receiving portion 154 and at the other end via fixing element 161 to the rail element 160. The fixing element 161 may be a screw cooperating with a bolt nut (not shown) in an interior space of the rail. The fixing element 161 can be secured at different heights on the rail element 160 so that the fixing bar and thus an illumination device can be arranged at different heights within the support frame. Instead of using fixing element 161, an actuator may be provided (not shown) via which the illumination device can be moved in relation to the frame. The actuator may comprise a motor to move the illumination device up and down. It should be understood that the mounting element 150 may be connected to the support frame of frame elements based on another mechanism than the mechanism shown in FIGS. 2 and 3.

FIGS. 4 and 5 show a support frame such as the support frame discussed above in connection with FIGS. 1-3. The embodiment of FIGS. 4 and 5 differs from the embodiment of FIGS. 1-3 by the fact that a suspension mechanism 170 is connected to one of the side surfaces of the support structure. As can be deduced from FIG. 11, the suspension mechanism 170 can help to suspend a system comprising the support frame 100 connected to other video panels 400 to a suspension rod 500. Referring back to FIGS. 4 and 5, an illumination device in the form of a moving head light fixture 300 is connected to the fixing bar 151. The moving head light fixture comprises a base 310, a yoke 320 rotatably connected to base 310 and a head 330 rotatably connected to the yoke 320.

It should be understood that any other kind of illumination device may be connected to the attachment mechanism.

The connecting elements used to connect the support frame 100 to at least one of the video panels are described in connection with FIGS. 3 and 13. The connecting element 120 comprises a U-shaped connector part 122 which is also shown in FIG. 4. This U-shaped connector part cooperates with a protrusion such as protrusion 123 shown in FIG. 3. This protrusion can also be located on a neighboring video panel so that the support frame 100 and the neighboring video panel are connected to each other with the help of the U-shaped connector part 122 provided on one of the support frame or neighboring video panel and protrusion 123 provided on the other of the support frame or video panel. The connecting pins 130 and the connecting receptacle 140 help to correctly align a U-shaped connector part 122 with protrusion 123. The connecting element furthermore comprises an actuating arm 124 which when actuated in the direction of the front surface of the system is able to move the U-shaped connector part 122 in the accommodating space generated behind the protrusion 123. In the embodiments shown in FIGS. 3 and 13, two of the side surfaces comprise the above-described connecting elements 120, wherein at least one of the other surfaces comprises the corresponding protrusion 123. It should be understood that the number of connecting elements 120 and protrusion 123 and its arrangement on the support frame may differ from the embodiment shown.

As can be deduced from FIGS. 11-13, the support frame 100 is dimensioned such that the overall size of the support frame preferably corresponds to the overall size of a video panel to which it is connected. In another embodiment, the support frame is used such that it replaces n video panels, n being an integer such as n=1, 2, 3. In the embodiment shown in FIGS. 11 and 12, a 2×3 matrix is used including four video panels 400 and two support frames 100. In another embodiment, a large number of video panels may be used in connection with any number of support frames interconnected with the video panels. In FIG. 12, a rear view of the system is shown. As can be deduced from this rear view, the video panel comprises different drivers 410, which are used for driving the light sources used in the video panel and which may receive control signals from a central control module (not shown) used to generate the control signal for all video panels. As a light source, LEDs may be used. However, it should be understood that any other light source such as OLED (organic LED), PLED (polymer LED), a fiber-optic light, a fluorescent light, an incandescent light, a neon light, polymer light emitting diodes, or a combinations thereof may be used.

As can be seen from FIG. 11, the light sources of the different video panels form a first planar surface on which the light sources of the video panels are provided. The light sources of the video panel emit the light to a front side of the interconnected video panels, whereas the rear side is the part of the system shown in FIG. 12. The attachment mechanism is now provided such that the illumination device, such as the moving head light fixture, also emits the light to the front surface which is the viewing surface for a user of the video panel wall.

The attachment mechanism is designed such that the light is emitted through the central opening 115, which is defined by the four frame elements 110-113.

Figure 6:
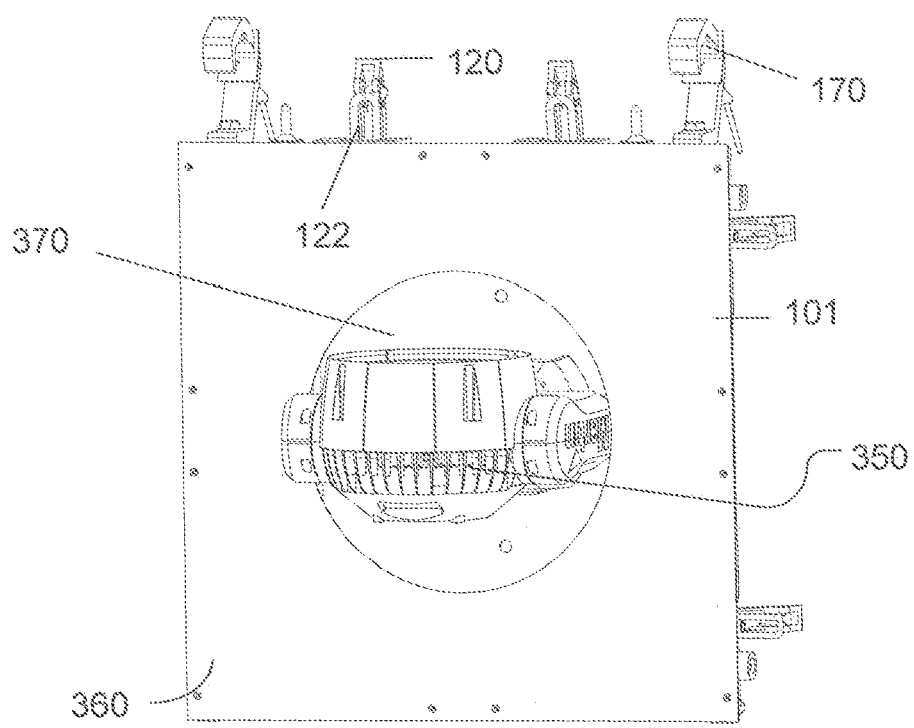
FIG. 6 shows a further embodiment of a support frame to which a moving head light fixture is connected.
Figure 7:
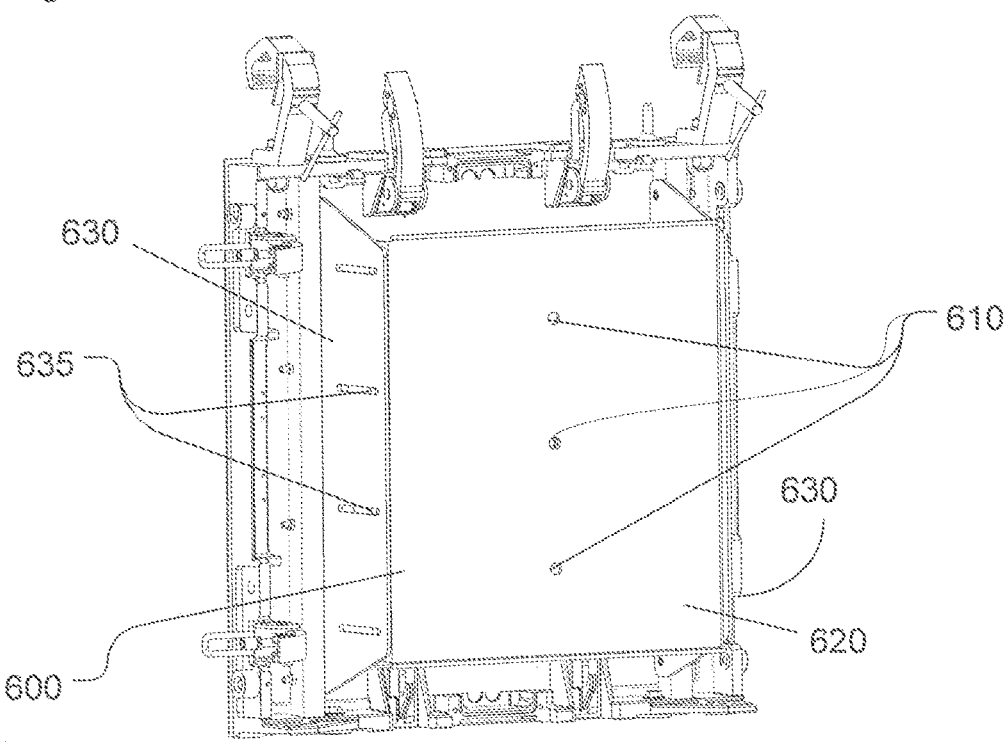
FIG. 7 is a perspective rear view of the support frame of FIG. 6.
Figure 8:
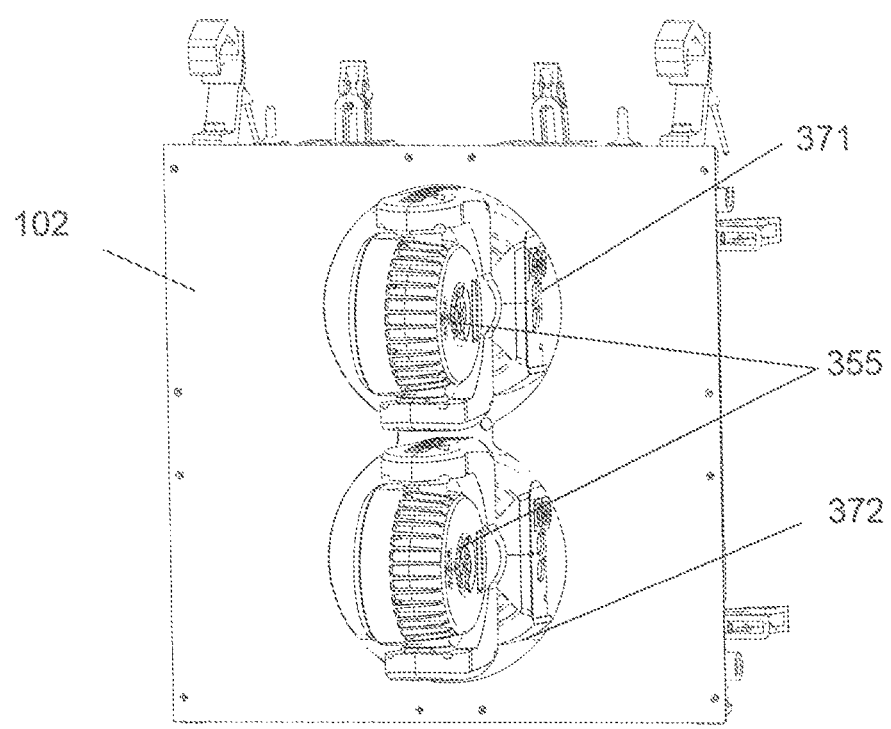
FIG. 8 shows a further support frame to be interconnected with video panels to which two moving head light fixtures are secured.

FIGS. 6 to 8 disclose further embodiments of the support frames 101, 102. The embodiments of FIGS. 6 to 8 differ from the embodiment discussed above in connection with FIGS. 1-5 by the fact that a different attachment mechanism is used to which a different illumination device 350 is connected. The illumination device 350 of FIGS. 6 and 7 is also a moving head light fixture; however, the moving head light fixture 350 may be of smaller dimensions and thus of less weight so that another attachment mechanism may be used. As can be especially deduced from FIG. 7, the attachment mechanism can comprise a support housing 600, which is provided on the rear side of the support frame 101. The support housing 600 comprises different mounting holes or mounting slots 610. The illumination device may comprise one or several mounting pins (not shown) via which the illumination device can be fixedly secured to the support frame 101 by introducing the mounting pin into the mounting slot. The mounting slots 610 are arranged on a rear surface 620 of the support housing. Furthermore, two side surfaces 630 are provided which can contain a number of oblong mounting guides 635. The oblong mounting guides can help to support the illumination device in the support housing. By way of example, the illumination device can be connected to oblong connecting pins to be inserted in the oblong mounting guides so that the illumination device is securely fixed to the support housing 600.

As can be deduced from FIG. 6, the support structure can furthermore contain a front plate 360, which covers a part of the support frame. The front plate is dimensioned such that an opening 370 is provided in the center of the front plate 360, through which the illumination device can extend or through which the light emitted from the illumination device can pass.

In the embodiment shown in FIG. 8, a slightly different embodiment of support frame 102 is shown in which two moving head light fixtures 355 are attached to the support housing 600 shown in FIG. 7. In the same way, the front plate 365 is different as it comprises two openings 371 and 372 in order to allow the light from the two illumination devices 355 to pass. The two illumination devices 355 may be connected to the support structure with the help of the mounting slots 610 or of the oblong mounting guides 635 or with the help of both of them.

Figure 9:
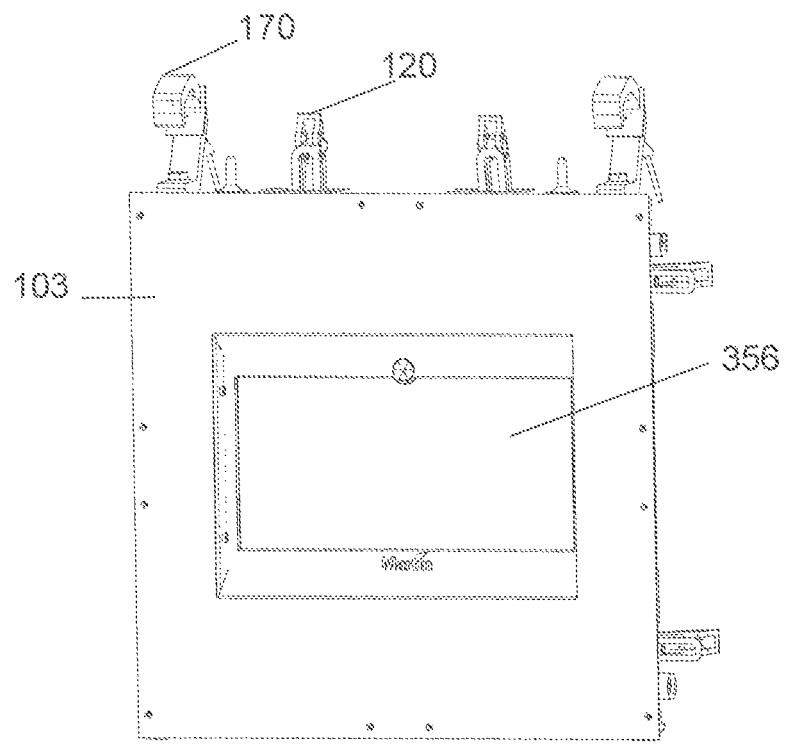
FIG. 9 shows a further embodiment of a support frame to be incorporated into a plurality of interconnected video panels with a strobe light being used as illumination device connected to the support frame.
Figure 10:
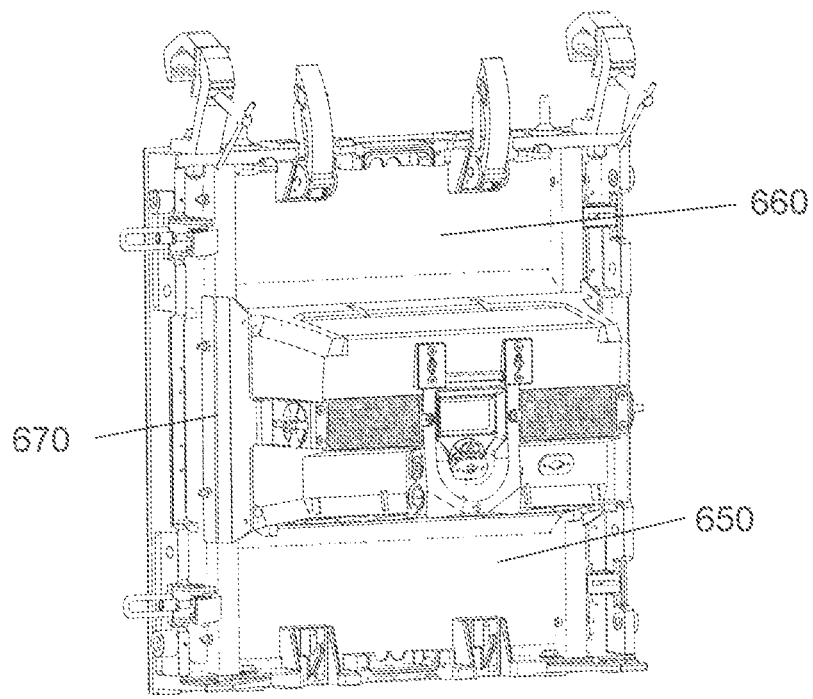
FIG. 10 is a perspective rear view of the support frame of FIG. 9.

FIG. 9 shows a further embodiment of a support structure which differs from the embodiments described above by the illumination device. The support frame 102 is provided with a strobe light 356. The attachment mechanism comprises support plates 670, which are connected to the support frame and which are connected to an outer casing of the strobe light. Furthermore, cover plates 660 and 650 are provided to cover the rest of the frame not covered by the strobe light 356.

Some general conclusions can be drawn from what is stated above. It is possible that two rail elements are provided to which the attachment mechanism is connected. The attachment mechanism can comprise a fixing bar to which the at least one illumination device can be fixedly secured. Furthermore, the attachment mechanism can comprise two mounting elements via which the fixing bar is connected to the support frame.

The interconnected video panels forming a video wall are often part of a touring production so that the different video panels have to be portable structures and have to be often assembled and disassembled. The fixing bar helps to easily connect the illumination device to the support frame and the fixing bar makes the assembly and disassembly faster and easier.

The two mounting elements can be connected to the support frame via a corresponding rail element. With the rail element, the mounting elements may be configured such that the mounting elements can be connected to the rail elements in different positions along the rail elements. It is thus possible to attach the illumination device in different positions in the support frame.

By way of example, the illumination device may be a moving head light fixture or a strobe light or any other light fixture.

Each mounting element can comprise an arm and a receiving section connected to the arm for accommodating the fixing bar. The receiving section can comprise an in inner concave surface forming a receiving space for the fixing bar. With such an arrangement, even personnel having low or no technical skills can easily connect the fixing bar to which the illumination device can be attached to the support structure.

The mounting element may comprise a securing mechanism which is configured to reduce the size of the receiving space in order to secure the fixing bar located in the receiving space to the mounting element. With this mechanism, e.g. a screwing mechanism, the fixing bar can be quickly connected to the support structure and can be quickly released from it.

For connecting the support structure to a neighboring video panel, the connecting elements may be provided on at least two sides of the support structure, wherein each connecting element comprises a latching arm configured to be fixed to a neighboring video panel. The at least one connecting element can furthermore comprise at least one of a connecting pin and a connecting receptacle. The connecting pin or the connecting receptacle can cooperate with a corresponding receptacle or pin at a neighboring video panel so that a defined positioning of the support structure relative to a video panel can be obtained.

A further possibility for attaching the illumination device to the support frame is such that the attachment mechanism comprises a support housing connected to at least one of the four frame elements forming the support structure. The support housing can comprise at least one mounting slot configured to fixedly support the illumination device to the support housing and thus to the support structure.

The support housing may be provided in order to connect illumination devices which may have less weight compared to the embodiment where the fixing bar is used for securely attaching the illumination device to the support frame. By way of example, when the illumination device is a moving head light fixture, a fixing bar may be used as the fixing bar may be able to carry heavier loads compared to the support housing. For a small moving head light fixture or a strobe light, the support housing may also be used.

The support housing may furthermore comprise a plurality of oblong mounting guides configured to fixedly support the illumination device to the support housing.

Additionally, an actuator may be provided configured to move the illumination device within the support structure.

Furthermore, it is possible that the support structure comprises a front plate which covers a part of the support structure on the front side, and which is dimensioned such that an aperture is present on the front side, wherein the illumination device emitting the light to the front side through this aperture.

Summarizing, the above-described examples provide the possibility to increase the possible light effects that can be generated by a system comprising interconnected video panels and comprising the above-described support frame. A variety of other light effects can be achieved in dependence on the illumination device that is secured to the support frame. In the above examples, a strobe light or a moving head light fixture was used as an illumination device. However, it should be understood that any other illumination device or a combination of illumination devices may be used.

We claim:

1. A support frame configured to be incorporated into a plurality of interconnected video panels, wherein each video panel emits a first light from a first light source to a front side of the interconnected video panels, the support frame comprising:
   at least one illumination device comprising at least one second light source that emits a second light, wherein the second light is physically separate from the first light source and differs from the first light by at least one light parameter,
   at least one connecting element configured to connect the support frame to at least one of the video panels,
   at least two rail elements configured to directly connect to the support frame, and
   an attachment mechanism configured to connect to the illumination device and the at least two rail elements, the attachment mechanism comprising:
      a plurality of fixing elements adapted to be fixedly secured to the at least two rail elements,
      a plurality of mounting elements adapted to connect to the plurality of fixing elements, and
      a fixing bar adapted to connect to the plurality of mounting elements and be fixedly secured to the at least one illumination device such that the at least one illumination device emits the second light to the front side of the interconnected video panels.

2. The support frame according to claim 1, further comprising four frame elements that enclose a central opening, wherein the at least one illumination device either emits the second light through the central opening to the front side or extends through the central opening to the front side.

3. The support frame according to claim 2, wherein the fixing bar extends from a first frame element to a second frame element of two opposite frame elements.

4. The support frame according to claim 1, wherein the at least one connecting element includes a plurality of connecting elements provided on at least two sides of the support frame, each connecting element included in the plurality of connecting elements comprising a latching arm configured to be fixed to a neighboring video panel.

5. The support frame according to claim 1, wherein the at least one connecting element comprises at least one of a connecting pin and a connecting receptacle.

6. The support frame according to claim 1, wherein the plurality of mounting elements are adapted to connect to the at least two rail elements in different relative positions along the each of the at least two rail elements.

7. The support frame according to claim 1, wherein each mounting element included in the plurality of mounting elements comprises:
an arm; and
a receiving portion connected to the arm adapted to accommodate the fixing bar, wherein the receiving portion comprises an inner concave surface forming a receiving space for the fixing bar.

8. The support frame according to claim 7, wherein each mounting element included in the plurality of mounting elements further comprises a securing mechanism adapted to reduce a size of the receiving space to secure the fixing bar located in the receiving space to the mounting element.

9. The support frame of claim 1, wherein the at least one illumination device comprises one of a strobe light or a moving head light fixture.

10. A system comprising
a plurality of interconnected video panels, each video panel comprising at least one first light source that emits a first light, and each video panel emitting light to a front side of the interconnected video panels,
a support frame comprising:
at least one connecting element of configured to connect the support frame to at least one of the plurality of interconnected video panels,
an illumination device comprising at least one second light source that emits a second light, wherein the second light is physically separate from the first light and differs from the first light by at least one light parameter, and
at least two rail elements configured to directly connect to the support frame, and
an attachment mechanism configured to connect to the illumination device and the at least two rail elements, the attachment mechanism comprising:
a plurality of fixing elements adapted to be fixedly secured to the at least two rail elements,
a plurality of mounting elements adapted to connect to the plurality of fixing elements, and
a fixing bar adapted to connect to the plurality of mounting elements and be fixedly secured to the illumination device such that the illumination device emits the second light to the front side of the interconnected video panels.

11. The support frame according to claim 10, wherein the at least one connecting element comprises a first connecting sub-element that includes a latching arm and a U-shaped connector, and a second connecting sub-element that includes a protrusion.

12. The support frame according to claim 10, wherein the attachment mechanism comprises a support housing comprising at least one mounting slot adapted to fixedly attach the illumination device to the support housing.

13. The support frame according to claim 12, wherein the support housing further comprises a plurality of oblong mounting guides adapted to fixedly attach the illumination device to the support housing.

14. The support frame according to claim 10, further comprising a front plate that covers a part of the support frame on the front side and is dimensioned such that an aperture is present on the front side, wherein the illumination device either emits the second light to the front side through the aperture or extends through the aperture to the front side.

15. A system comprising:
a plurality of interconnected video panels forming a first planar surface perpendicular to ground, each video panel comprising at least one first light source that emits a first light, and each video panel emitting light to a front side of the interconnected video panels; and
a support frame comprising:
at least one connecting element configured to connect the support frame to at least one of the plurality of interconnected video panels,
an illumination device on a second planar surface perpendicular to ground behind the first planar surface, comprising at least one second light source that emits a second light, wherein the second light is physically separate from the first light, differs from the first light by at least one light parameter, and emits light to the front side of the support frame, and
an attachment mechanism adapted to be fixedly secured to the illumination device such that the illumination device emits the second light to the front side of the interconnected video panels.

16. The system according to claim 15, wherein the front side of the illumination device is positioned at the second planar surface.

17. A support frame configured to be incorporated into a plurality of interconnected video panels forming a first planar surface perpendicular to ground, wherein each video panel emits a first light from a first light source to a front side of the interconnected video panels, the support frame comprising:
at least one connecting element configured to connect the support frame to at least one of the plurality of interconnected video panels,
an illumination device on a second planar surface perpendicular to ground behind the first planar surface, comprising at least one second light source that emits a second light, wherein the second light is physically separate from the first light, differs from the first light by at least one light parameter, and emits light to the front side of the support frame, and
an attachment mechanism adapted to be fixedly secured to the illumination device such that the illumination device emits the second light to the front side of the interconnected video panels.

* * * * *